US012562729B2

(12) United States Patent
Unterkircher et al.

(10) Patent No.: US 12,562,729 B2
(45) Date of Patent: Feb. 24, 2026

(54) FILTER WITH LOW LEAKAGE POWER-DOWN SWITCHES

(71) Applicant: Infineon Technologies AG, Neubiberg (DE)

(72) Inventors: Peter Unterkircher, Engerwitzdorf (AT); Ralf-Rainer Schledz, Raab (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 60 days.

(21) Appl. No.: 18/606,645

(22) Filed: Mar. 15, 2024

(65) Prior Publication Data

US 2025/0293683 A1     Sep. 18, 2025

(51) Int. Cl.
*H03K 17/16*     (2006.01)
*H03F 3/45*     (2006.01)
*H03K 17/687*     (2006.01)

(52) U.S. Cl.
CPC ....... *H03K 17/162* (2013.01); *H03F 3/45085* (2013.01); *H03K 17/687* (2013.01); *H03F 2203/45084* (2013.01)

(58) Field of Classification Search
CPC ................ H03K 17/162; H03K 17/687; H03F 3/45085; H03F 2203/45084; H03F 3/005; H03H 11/1204; H03H 19/004; H03H 2210/025; H03H 7/0153; G05F 1/10; G05F 3/08; G05F 3/02; G11C 5/147
See application file for complete search history.

(56) References Cited

U.S. PATENT DOCUMENTS

| | | | |
|---|---|---|---|
| 8,977,217 B1 | 3/2015 | Connick et al. | |
| 11,909,369 B2 * | 2/2024 | Chang ..................... | H03H 7/06 |
| 2004/0090281 A1 | 5/2004 | Vilander | |
| 2008/0080235 A1 | 4/2008 | Tran | |
| 2021/0336586 A1 | 10/2021 | Lee et al. | |
| 2022/0006433 A1 | 1/2022 | Boescke | |
| 2023/0188147 A1 | 6/2023 | Choi et al. | |

FOREIGN PATENT DOCUMENTS

CN     204993258 U     1/2016

* cited by examiner

*Primary Examiner* — Jung Kim
(74) *Attorney, Agent, or Firm* — Slater Matsil, LLP

(57)     ABSTRACT

A circuit includes: a low-pass filter that includes a resistor coupled between a first node and a second node, and a capacitor coupled between the second node and a reference node. The circuit further includes: a first transistor, where a drain terminal of the first transistor is coupled to the second node, and a source terminal of the first transistor is coupled to the first node; and a second transistor, where a drain terminal of the second transistor is coupled to the first node, and a source terminal of the second transistor is coupled to the reference node, where a gate terminal of the first transistor and a gate terminal of the second transistor are coupled to a control node.

20 Claims, 4 Drawing Sheets

FILTER WITH LOW LEAKAGE POWER-DOWN SWITCHES

TECHNICAL FIELD

The present invention relates generally to circuits, and in particular embodiments, circuits with low leakage power-down switches.

BACKGROUND

In noise-sensitive applications such as radio frequency (RF) receivers, filters (e.g., low-pass filters) are often used to remove or suppress unwanted noise from the signal of interest. For example, in the RF front-end processing chain of an RF receiver, due to the stringent noise requirements of the operational amplifiers, noise filters (e.g., low-pass filters) are used to suppress noise from the bias current, and/or to suppress noise resulting from the biasing structures inside the operational amplifiers.

The noise filters (e.g., resistor-capacitor (RC) filters) in the RF front-end and other circuits often use large resistors having resistances between, e.g., a few mega ohms (M ($\Omega$) to tens of mega ohms. Due to the large electrical resistances, the voltage drops across these resistors (also referred to as IR drop) are susceptible to all kinds of leakage currents. A dominant source of leakage current comes from the power-down (PD) switches connected to the noise filters. There is a need in the art for PD switches that produce very low leakage current when the PD switches are turned off.

SUMMARY

In accordance with an embodiment, a circuit comprises: a low-pass filter that includes a resistor coupled between a first node and a second node, and a capacitor coupled between the second node and a reference node. The circuit further comprises: a first transistor, wherein a drain terminal of the first transistor is coupled to the second node, and a source terminal of the first transistor is coupled to the first node; and a second transistor, wherein a drain terminal of the second transistor is coupled to the first node, and a source terminal of the second transistor is coupled to the reference node, wherein a gate terminal of the first transistor and a gate terminal of the second transistor are coupled to a control node.

In accordance with an embodiment, a circuit comprises: a low-pass filter comprising a resistor and a capacitor, wherein the resistor is coupled between a first node and a second node, and the capacitor is coupled between the second node and a reference node; and a power-down circuit comprising a first transistor and a second transistor coupled in series between the second node and the reference node, wherein a drain terminal of the first transistor is coupled to the second node, wherein a source terminal of the first transistor is coupled to the first node and coupled to a drain terminal of the second transistor, wherein a source terminal of the second transistor is coupled to the reference node, wherein a gate terminal of the first transistor and a gate terminal of the second transistor are coupled to an input terminal of the power-down circuit.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EXAMPLES

Figure 1:
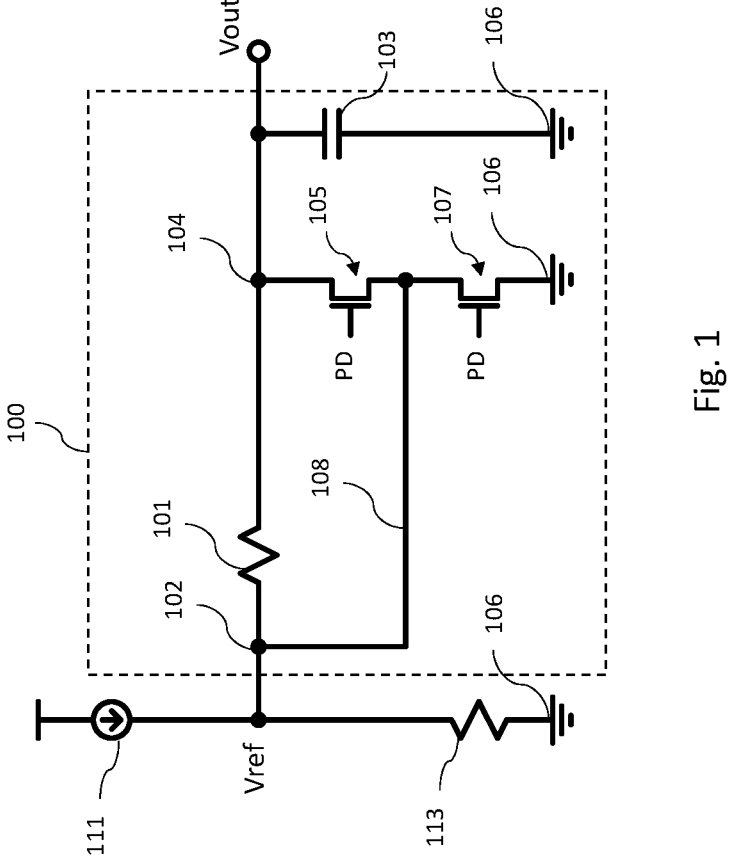
FIG. 1 illustrates a low-pass filter (LPF) with power-down (PD) switches, in an embodiment.

The making and using of the presently disclosed examples are discussed in detail below. It should be appreciated, however, that the present invention provides many applicable inventive concepts that can be embodied in a wide variety of specific contexts. The specific examples discussed are merely illustrative of specific ways to make and use the invention, and do not limit the scope of the invention. Throughout the discussion herein, unless otherwise specified, the same or similar reference numerals in different figures refer to the same or similar component. For simplicity, details of components with the same or similar reference numeral may not be re-described.

The present disclosure will be described with respect to examples in a specific context, and in particular, low-leakage power-down (PD) switches and LPFs with low-leakage PD switches.

FIG. 1 illustrates a low-pass filter (LPF) 100 with power-down (PD) switches 105 and 107, in an embodiment. For ease of discussion, the LPF 100 with PD switches are also referred to as LPF 100 in the discussion herein. The LPF 100 includes a resistor 101 and a capacitor 103 that form a resistor-capacitor (RC) low-pass filter. The resistor 101 is coupled between a node 102 (which corresponds to an input terminal of the LPF 100) and a node 104 (which corresponds to an output terminal of the LPF 100). The capacitor 103 is coupled between the node 104 and a reference node 106. In the discussion herein, "reference node" refers to a node configured to be coupled to a reference voltage, which reference voltage may be, e.g., electrical ground or a fixed voltage (e.g., a supply voltage $V_{DD}$). In the example of FIG. 1, the reference node 106 is coupled to electrical ground.

The LPF 100 further includes PD switches 105 and 107. In the illustrated embodiments, the PD switches 105 and 107 are metal-oxide-semiconductor (MOS) transistors, and therefore, the PD switches 105 and 107 may also be referred to as PD transistors 105 and 107, or transistors 105 and 107 in the discussion herein. In the example of FIG. 1, the PD switches 105 and 107 are N-type MOS transistors (also referred to as NMOS transistors) coupled in series between the node 104 and the reference node 106. For example, the drain terminal of the PD switch 105 is coupled to the node 104, and the source terminal of the PD switch 105 is coupled to the node 102. The drain terminal of the PD switch 107 is coupled to the source terminal of the PD switch 105 and the node 102, and the source terminal of the PD switch 107 is coupled to the reference node 106. The gate terminal of the PD switch 105 and the gate terminal of the PD switch 107 are coupled together, and are configured to be coupled to a control signal PD during operation of the LPF 100. The PD switches 105 and 107 form a power-down (PD) circuit of the LPF 100. Details regarding the operation of the PD circuit are discussed hereinafter.

FIG. 1 further illustrates a current source 111 and a resistor 113. The current source 111 and a resistor 113 form a reference voltage generator circuit, which provides a reference voltage $V_{ref}$ at the node 102 of the LPF 100. For example, the current source 111 may provide a supply current of 200 μA, the resistor 113 may have a resistance of about 2.5 KΩ, and the reference voltage $V_{ref}$ at the node 102 may be 500 mV. Note that the current source 111 and the resistor 113 are not part of the LPF 100, but are shown to facilitate discussion of the operation of the LPF 100. Although the voltage at the node 102 (e.g., the input terminal of the LPF 100) is illustrated as being provided by a reference voltage generator circuit, the voltage at the node 102 may be provided by any suitable preceding circuits of the LPF 100. For example, the voltage at the node 102 may be generated by a circuit in an RF front-end of an RF receiver.

The LPF 100 shown in FIG. 1 may be part of a larger circuit that includes additional circuits coupled to the node 104. For example, an operational amplifier, an analog-to-digital converter (ADC), or the like, may be coupled to the node 104 for further processing of the output signal $V_{out}$ at the node 104. In some embodiments, the LPF 100 is used to filter out noise contained in the input signal at the node 102 (e.g., the reference voltage $V_{ref}$), such that a cleaner (e.g., containing less noise), more stable output signal (e.g., the output voltage $V_{out}$) is available at the node 104 for further processing by a subsequent circuit coupled to the node 104. The PD switches 105 and 107 form a power-down circuit of the LPF 100. When the preceding and subsequent circuits connected to the LFP 100 are powered down (e.g., to save power in a standby mode), the power-down circuit of the LPF 100 is turned on (e.g., transistors 105 and 107 are turned on) to pull down the voltage at the node 104 to a fixed, known voltage (e.g., electrical ground), such that the output voltage at the node 104 is not floating. When the preceding and subsequent circuits connected to the LPF 100 are powered on (e.g., working to process signals), the power-down circuit of the LPF 100 is turned off (e.g., transistors 105 and 107 are turned off), such that the input signal at the node 102 passes through (e.g., is filtered by) the LPF 100, and the filtered signal is outputted at the node 104 for further processing. More details are discussed hereinafter.

In some embodiments, during operation of the LPF 100, the control signal PD toggles between a first voltage (e.g., a positive voltage) and a second voltage (e.g., a zero voltage), where the transistors 105 and 107 are configured to be turned on when the control signal PD has the first voltage, and are configured to be turned off when the control signal PD has the second voltage. In the example of FIG. 1, the transistors 105 and 107 are NMOS transistors and have positive threshold voltages. Therefore, when the first voltage is higher than the threshold voltages of the transistors 105 and 107, the transistors 105 and 107 are turned on. An example is discussed below to illustrate operation of the LPF 100.

As an example, consider the following parameters and operating conditions for the LPF 100 in FIG. 1. The resistor 101 has a resistance of 1 MΩ, and the capacitor 103 has a capacitance of 10 pF. The reference voltage $V_{ref}$ supplied to the node 102 is 500 mV. The control signal PD is controlled by a controller (e.g., a micro-controller, not illustrated) to toggle between a first voltage (e.g., +1.5 V) and a second voltage (e.g., 0 V). During operation of the LPF 100, when the control signal PD has the first voltage (e.g., +1.5 V), the gate-source voltage $V_{GS}$ of the transistor 107 is +1.5 V, which is higher than the threshold voltage of the transistor 107, and therefore, the transistor 107 is turned on, pulling down the voltage at the node 102 to electrical ground. As a result, the gate-source $V_{GS}$ of the transistor 105 also becomes +1.5 V, which is higher than the threshold voltage of the transistor 105, and therefore, the transistor 105 is also turned on. Since the transistor 105 and 107 are both turned on, the voltage at the node 104 is pulled down to the voltage of the reference node 106 (e.g., electrical ground, or zero volt). In other words, when the PD circuit of the LPF 100 is turned on, the output voltage $V_{out}$ of the LPF 100 in FIG. 1 is pulled down to a fixed, known voltage (e.g., zero volt).

Conversely, when the control signal PD has the second voltage (e.g., 0 V), the gate-source voltage $V_{GS}$ of the transistor 105 is −500 mV, and the gate-source voltage $V_{GS}$ of the transistor 107 is 0 V. Both transistors 105 and 107 in FIG. 1 are NMOS transistors and have positive threshold voltages. The transistor 107 is turned off, due to its gate-source voltage $V_{GS}$ of zero volt being lower than its threshold voltage. The transistor 105 is also turned off. Note that the gate-source voltage $V_{GS}$ of the transistor 105 is negative (e.g., −500 mV), which puts the transistor 105 deeper in the OFF state, and as a result, the leakage current of the transistor 105 (which flows between its drain terminal and source terminal) is orders of magnitude smaller than the leakage current of the transistor 107. In some embodiments, the leakage current of the transistor 105 is equal to or smaller than one thousandth (e.g., ≤1/1000) of the leakage current of the transistor 107. For example, the leakage current of the transistor 107 may be, e.g., 10 nA, and the leakage current of the transistor 105 may be, e.g., 1 pA. When the transistors 105 and 107 are turned off, the signal at the node 102 is filtered by the LPF 100, and the filtered signal is outputted at the node 104 for further processing. In other words, the PD circuit of the LPF 100 is turned off when the preceding and subsequent circuits of the LPF 100 are turned on (e.g., working to process signals).

The drastically reduced leakage current (e.g., due to its negative gate-source voltage $V_{GS}$) of the transistor 105 results in drastically reduced IR drop across the resistor 101, which in turn drastically reduces the voltage drop at the node 104. To appreciate the advantage of the disclosed LPF 100 with a PD circuit (e.g., the transistors 105 and 107), consider a reference LPF design with another PD circuit, where the another PD circuit only includes the transistor 107 (e.g., replacing the transistor 105 with a direct conductive path between the node 104 and the drain terminal of the transistor 107), and the conductive path 108 connecting the node 102 and the drain terminal of the transistor 107 in FIG. 1 is removed. When the transistor 107 in the reference LPF design is turned off (e.g., when the control signal PD has a voltage of zero volt), the leakage current of the transistor 107 in the reference design is relatively large, e.g., about 10 nA. The leakage current flows through the resistor 101 of the reference design and causes a relatively large IR drop of 10 mV (e.g., 10 nA×1 MΩ=10 mV). In contrast, the disclosed LPF 100 with PD circuit has a small leakage current of, e.g., 1 pA for the transistor 105, and this small leakage current (e.g., 1 pA) flows through the resistor 101 and causes a negligible IR drop of 1 μV (e.g., 1 pA×1 MΩ=1 μV). In some embodiments, the IR drop across the resistor 101 is considered as substantially zero when the IR drop is equal to or smaller than about 10 μV. In other words, when the PD circuit of the LPF 100 is turned off, the voltage drop across the resistor 101 is substantially zero. Note that the leakage current of the transistor 107 in the LPF 100 is also relatively large, e.g., 10 nA. However, this relatively large leakage current (e.g., 10 nA) flows through the conductive path 108 and the transistor 107, and does not flow through the resistor 101, thus does not affect the IR drop across the resistor 101.

Figure 2:
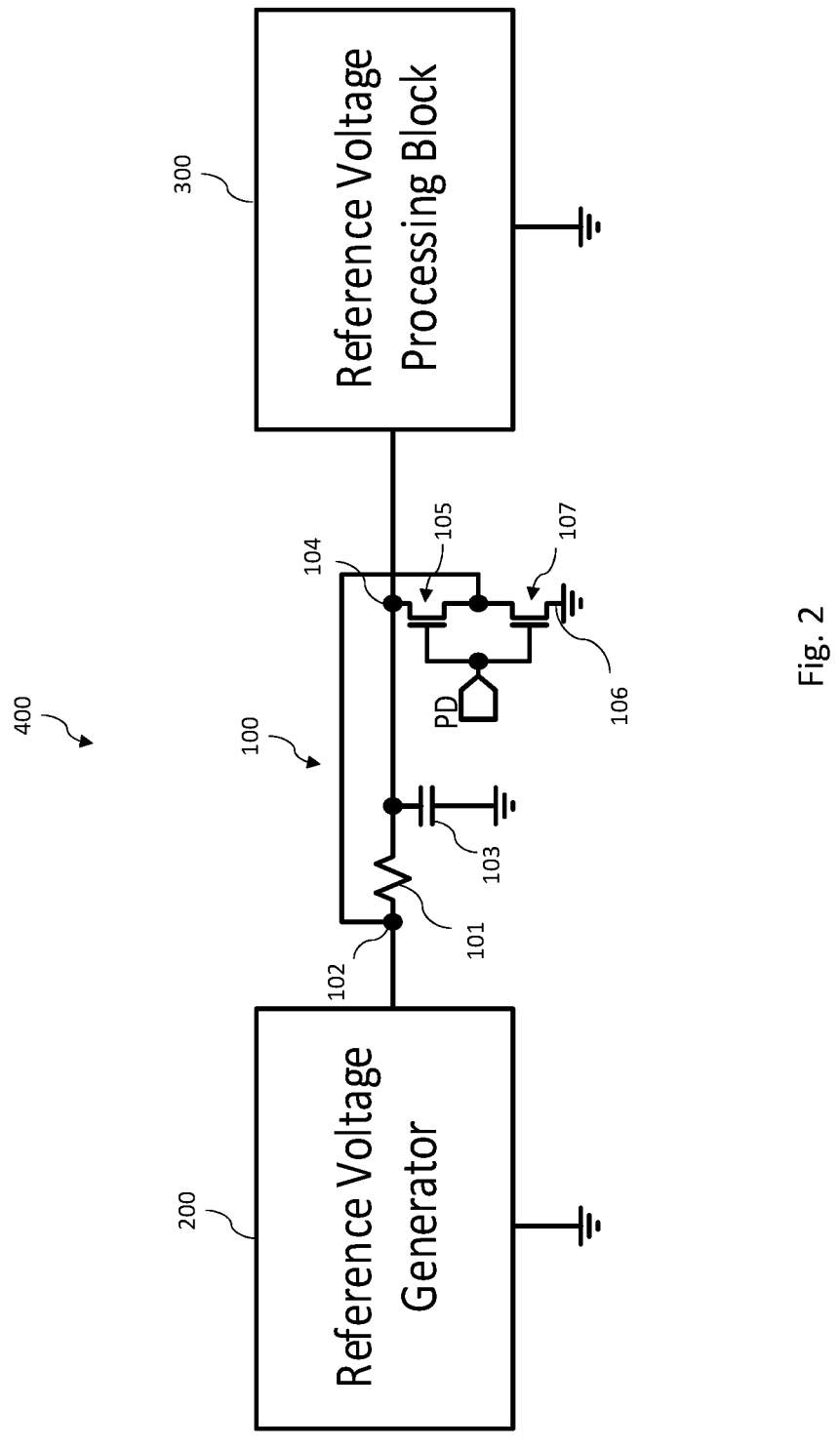
FIG. 2 illustrates a circuit that includes a reference voltage generator, an LPF with PD switches, and a reference voltage processing block, in an embodiment.

FIG. 2 illustrates a circuit 400 that includes a reference voltage generator 200, the LPF 100 with PD switches, and a reference voltage processing block 300, in an embodiment. The circuit 400 of FIG. 2 illustrates an example application of the LPF 100 in FIG. 1. The reference voltage generator 200 generates a reference voltage at the node 102 of the LPF 100. The reference voltage generator 200 may be the same as or similar to the reference voltage generator circuit shown in FIG. 1, or may be any suitable reference voltage generator. The LPF 100 in FIG. 2 (or other figures) is the same as the LPF 100 in FIG. 1. The reference voltage processing block 300 includes circuits for processing the output signal of the LPF 100. Examples of the reference voltage processing block 300 includes operational amplifiers, analog-to-digital converters, and the like. When the PD switches of the LPF 100 are turned off, the reference voltage generated by the reference voltage generator 200 is filtered by the LPF 100, and the output of the LPF 100 (e.g., at the node 104) is sent to the input terminal of the reference voltage processing block 300 for further processing. When the reference voltage generator 200 and the reference voltage processing block 300 are powered down (e.g., to save power), the PD switches of the LPF 100 are turned on, and the voltage at the node 104 of the LPF 100 is pulled down to electrical ground. The circuit 400 illustrated in FIG. 2, or portions of it, may be implemented in an integrated circuit (IC) device.

Figure 3:
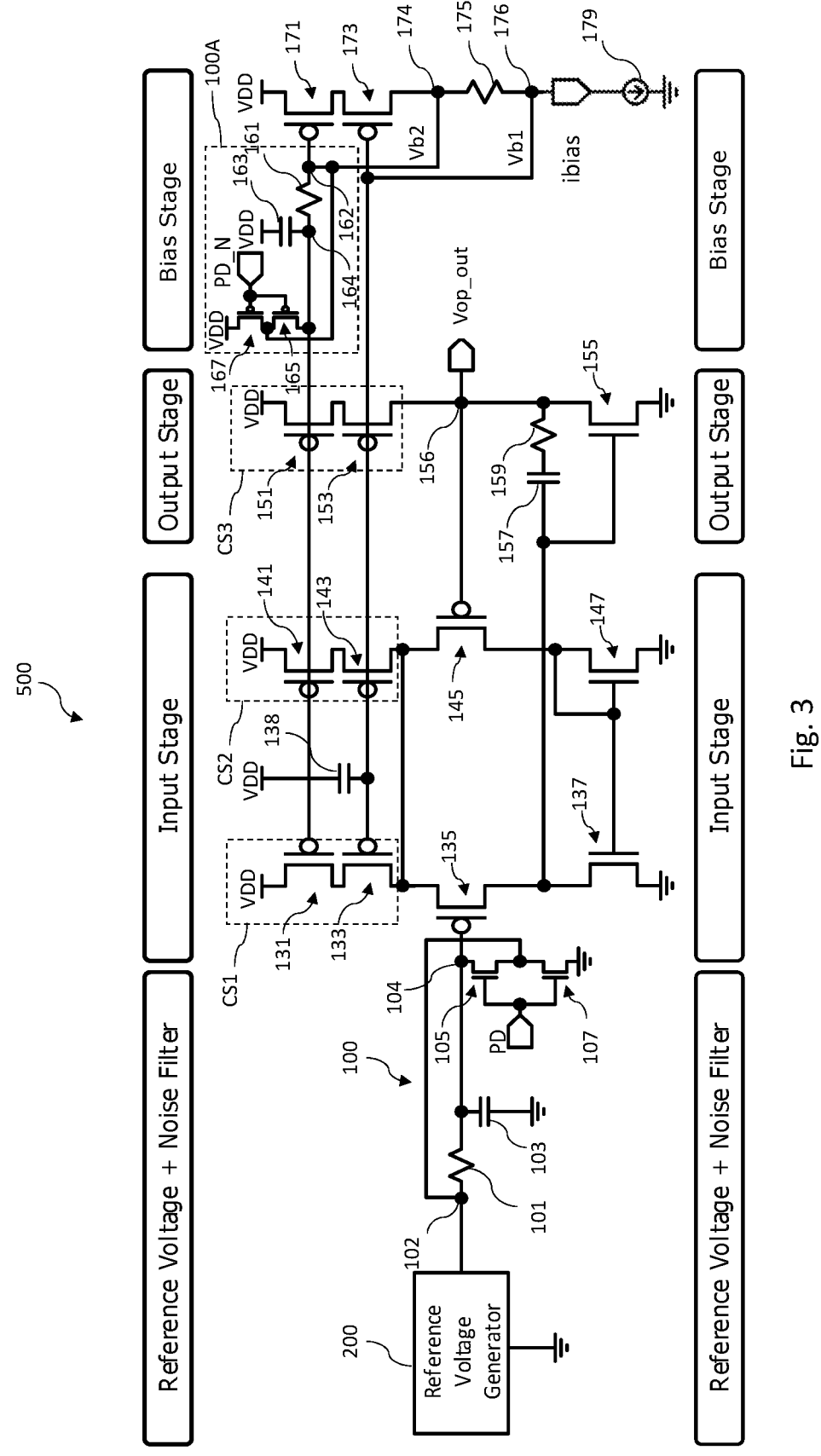
FIG. 3 illustrates a circuit that includes an LPF with PD switches and an operational amplifier, in an embodiment.

FIG. 3 illustrates a circuit 500 that includes the LPF 100 and an operational amplifier coupled to the output of the LPF 100, in an embodiment. The operational amplifier illustrated in FIG. 3 is a Miller operational amplifier, which is illustrated as comprising an Input Stage, an Output Stage, and a Bias Stage. Note that for simplicity, no all features of the circuit 500 are illustrated. The circuit 500 illustrated in FIG. 3 may be considered as a specific example of the circuit 400 in FIG. 2, where the Miller operational amplifier in FIG. 3 corresponds to the reference voltage processing block 300 in FIG. 2. In FIG. 3, the reference voltage generator 200 and the LPF 100 illustrated in the Reference Voltage+Noise Filter Stage of the circuit 500 are the same as or similar to those illustrated in FIG. 1 or FIG. 2, thus details are not repeated. The circuit 500 illustrated in FIG. 3, or portions of it, may be implemented in an integrated circuit (IC) device.

As illustrated in FIG. 3, the Miller operational amplifier includes circuits in the Input Stage, the Output Stage, and the Bias Stage. The function of the Miller operational amplifier in FIG. 3 is to keep the output voltage of the Miller operational amplifier at the node 156 the same as the voltage at the node 104 of the LPF 100, therefore providing a buffered voltage at an output pad $V_{op\_out}$ (which is coupled to the node 156) of the circuit 500 (e.g., an IC device). The noise at the node 102 of the LPF 100 is low-pass filtered by the LPF 100. Therefore, the voltage at the output pad $V_{op\_out}$ contains little or no noise from the reference voltage generator 200.

In FIG. 3, the transistors 135 and 145 in the Input Stage of the Miller operational amplifier form a differential pair with a current mirror load, which current mirror load includes a current source CS1 (formed by P-type MOS (PMOS) transistors 131 and 133) and a current source CS2 (formed by PMOS transistors 141 and 143). A supply voltage $V_{DD}$ (e.g., having a voltage of +1.5 V) is used to power the Miller operational amplifier. When enabled (e.g., by logic low voltages applied at the gate terminals of the transistors 131 and 133), the current source CS1 provides a current of, e.g., 20 µA, that flows through the transistors 131, 133, 135, and 137. Similarly, when enabled (e.g., by logic low voltages applied at the gate terminals of the transistors 141 and 143), the current source CS2 provides a current of, e.g., 20 µA, that flows through the transistors 141, 143, 145, and 147.

The Output Stage of the Miller operational amplifier (also referred to as a common source stage) includes a transistor 155 as a pass device, and includes a current source CS3 (formed by PMOS transistor 151 and 153) serving as a load. The capacitor 157 is the Miller capacitor, and the resistor 159 is the Miller resistor. When enabled, the current source CS3 provides a current of, e.g., 80 µA, that flows through the transistors 151, 153, and 155.

The Bias Stage of the Miller operational amplifier includes PMOS transistors 171 and 173 and a resistor 175 connected in a high swing cascode configuration. The resistor 175 is coupled between a node 174 and a node 176. An input/output (I/O) pad ibias is coupled to the node 176, and is configure to receive a bias current. For example, a current source 179 may be connected to the I/O pad ibias to provide a bias current of, e.g., 20 µA during operation of the circuit 500, such that the voltage drop across the resistor 175 is 0.2 V, with the voltage at the node 174 being +1 V and the voltage at the node 176 being +0.8 V. In the illustrated example, the current source 179 is not part of the Miller operational amplifier, and is external to the IC device comprising the Miller operational amplifier. The bias current provides current biasing for the current sources CS1, CS2, and CS3, such that the current flowing through them is predictable (e.g., constant) over process variations, temperature variations, supply voltage variations, and so on. The transistors 171 and 173 (e.g., PMOS transistors) provide voltages to properly bias the current sources CS1, CS2, and CS3, such that they operate in the right operating mode.

In some embodiments, the voltage $V_{b1}$ at the node 176 is less susceptible to noise in the bias current, and is filtered by a capacitor 138 coupled between the node 176 and the supply voltage node having a supply voltage of $V_{DD}$ (e.g., +1.5 V). The gate terminals of the transistors 133, 143, 153, and 173 are supplied with the voltage $V_{b1}$ at the node 176. The voltage $V_{b2}$ at the node 174 is filtered by an LPF 100A with PD switches, and the output of the LPF 100A is coupled to the gate terminals of transistors 131, 141, and 151. Details of the LPF 100A are discussed below.

The LPF 100A with PD switches is similar to the LPF 100 of FIG. 1, with a low-pass filter formed by a resistor 161 and a capacitor 163. The node 162 corresponds to the input terminal of the LPF 100A, and the node 164 corresponds to the output terminal of the LPF 100A. The PD switches of the LPF 100A includes transistors 165 and 167 (e.g., PMOS transistors) coupled in series between the node 164 and a supply voltage node having the supply voltage $V_{DD}$. The gate terminals of the transistor 165 and 167 are coupled together, and are controlled by a control signal PD_N. As illustrated in FIG. 3, the drain terminal of the transistor 165 is coupled to the node 164, and the source terminal of the transistor 165 is coupled to the node 162 and the drain terminal of the transistor 167. The source terminal of the transistor 167 is coupled to a reference node, which in this case is a supply voltage node having the supply voltage $V_{DD}$.

Note that the transistors 165 and 167 of the LPF 100A are PMOS transistors (instead of NMOS transistors as in the LPF 100), and therefore, the polarity of the control signal PD_N for turning on or off the PMOS transistors 165 and

167 is opposite of the polarity of the control signal PD for turning on or off the NMOS transistors 105 and 107. In other words, for the LPF 100A, when the control signal PD_N has a logic high value (e.g., having a voltage of +1.5 V), the transistors 165 and 167 are turned off, the signal at the node 162 is filtered by the LPF 100A and outputted at the node 164. When the control signal PD_N has a logic low value (e.g., having a voltage of 0 V), the transistors 165 and 167 are turned on, the voltage at the node 164 is pulled up to the supply voltage $V_{DD}$ (e.g., +1.5 V), and the supply voltage $V_{DD}$ turns off the PMOS transistors 131, 141, and 151 to power down the current sources CS1, CS2, and CS3. In some embodiments, the control signal PD for the LPF 100 is inverted by an inverter and used as the control signal for the LPF 100A.

An example is discussed herein to illustrate the operation of the LPF 100A. Consider an example where, during operation of the circuit 500, the voltage applied at the node 162 is +1 V, and the supply voltage $V_{DD}$ is +1.5 V. Following similar analysis for the LPF 100, when the control signal PD_N is high (e.g., +1.5 V), the gate-source voltage $V_{GS}$ of the PMOS transistor 167 is 0 V, and the gate-source voltage $V_{GS}$ of the PMOS transistor 165 is +0.5 V. Since the threshold voltage of a PMOS transistor has a negative value, the positive gate-source voltage $V_{GS}$ (e.g., +0.5 V) of the PMOS transistor 165 puts the PMOS transistor 165 deeper in the OFF state than the PMOS transistor 167. As a result, the leakage current of the PMOS transistor 165 is orders of magnitude smaller than (e.g., equal to or less than $1/1000$ of) the leakage current of the PMOS transistor 167. For example, the leakage current of the PMOS transistor 167 may be 10 nA, and the leakage current of the PMOS transistor 165 may be 1 pA. Since the resistor 161 tends to have large resistance (e.g., a few mega ohms or more), the drastically reduced leakage current for the PMOS transistor 165 results in drastically reduced IR drop across the resistor 161, which in turn reduces voltage drop in the output signal of the LPF 100A.

Figure 4:
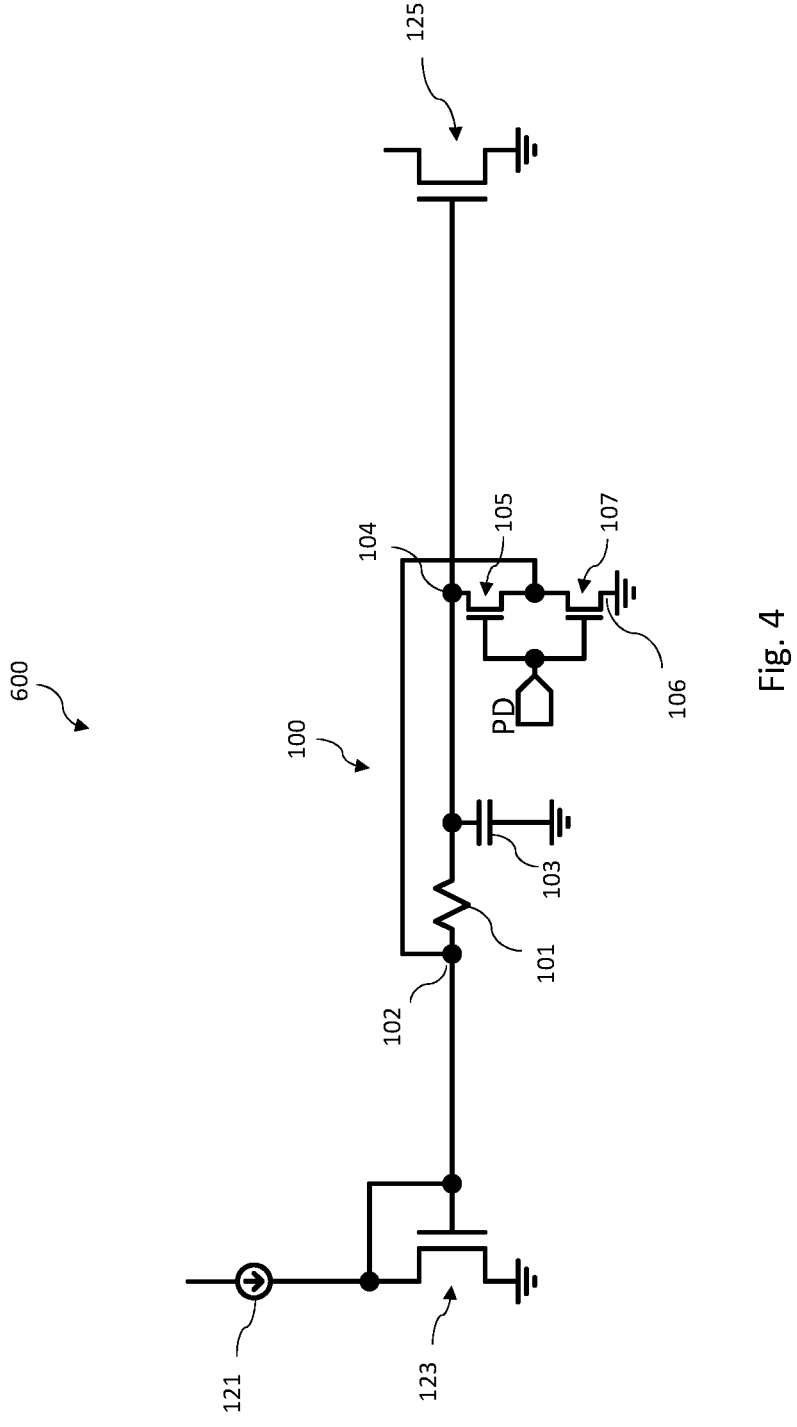
FIG. 4 illustrates a current mirror circuit having an integrated LPF with PD switches, in an embodiment.

FIG. 4 illustrates a current mirror circuit 600 having an integrated LPF 100 with PD switches, in an embodiment. Note that for simplicity, no all features of the current mirror circuit 600 are illustrated. The current mirror circuit 600 of FIG. 3 includes a current source 121, a transistor 123, and a transistor 125. In addition, the current mirror circuit 600 includes the LPF 100 with PD switches. The LPF 100 is coupled between the gate terminal of the transistor 123 and the gate terminal of the transistor 125. The LPF 100 in FIG. 4 is used to filter out noise in the current source. Details regarding the operation of the LPF 100 with PD switches in FIG. 4 are the same as or similar to those discussed above for the LPF 100 in FIG. 1, thus not repeated. The current mirror circuit 600 illustrated in FIG. 4, or portions of it, may be implemented in an integrated circuit (IC) device.

In FIG. 4, the transistor 123 is in a diode connected configuration, where the gate terminal of the transistor 123 is coupled to the drain terminal of the transistor 123. The drain terminal of the transistor 123 is coupled to an output terminal of the current source 121, the source terminal of the transistor 123 is coupled to the reference node 106, and the gate terminal of the transistor 123 is coupled to the node 102 of the LPF 100. The gate terminal of transistor 125 is coupled to the node 104 of the LPF 100, and the source terminal of the transistor 125 is coupled to the reference node 106.

Embodiments may achieve advantages as described below. The disclosed LPF (e.g. 100 or 100A) includes PD transistors, which are turned off during power down of portions of the device containing the LPF. By putting one of the PD transistors of the LPF deep in the OFF state, the leakage current of that PD transistor is drastically reduced, which results in drastically reduced IR drop and distortion in the output signal of the LPF.

Examples of the present invention are summarized here. Other examples can also be understood from the entirety of the specification and the claims filed herein.

Example 1. In an embodiment, a circuit includes: a low-pass filter comprising a resistor coupled between a first node and a second node; and a capacitor coupled between the second node and a reference node. The circuit further comprises: a first transistor, wherein a drain terminal of the first transistor is coupled to the second node, and a source terminal of the first transistor is coupled to the first node; and a second transistor, wherein a drain terminal of the second transistor is coupled to the first node, and a source terminal of the second transistor is coupled to the reference node, wherein a gate terminal of the first transistor and a gate terminal of the second transistor are coupled to a control node.

Example 2. The circuit of Example 1, wherein during operation of the circuit, the control node is configured to provide a control signal, wherein the control signal is configured to toggle between a first voltage and a second voltage, wherein the first transistor and the second transistor are configured to be turned on when the control signal has the first voltage, and are configured to be turned off when the control signal has the second voltage.

Example 3. The circuit of Example 2, wherein when the first transistor and the second transistor are turned off, a first leakage current flowing through the first transistor is equal to less than one thousandth of a second leakage current flowing from the first node via the second transistor to the reference node.

Example 4. The circuit of Example 3, wherein when the first transistor and the second transistor are turned off, a voltage at a first terminal of the resistor is substantially equal to a voltage at a second terminal of the resistor.

Example 5. The circuit of Example 2, wherein the first node is configured to be supplied with a third voltage during operation of the circuit.

Example 6. The circuit of Example 5, wherein the first transistor and the second transistor are N-type metal-oxide-semiconductor (MOS) transistors.

Example 7. The circuit of Example 6, wherein the reference node is an electrical ground node, wherein the first voltage has a positive value, and the second voltage is zero.

Example 8. The circuit of Example 7, wherein the first voltage is higher than a first threshold voltage of the first transistor and a second threshold voltage of the second transistor.

Example 9. The circuit of Example 7, further comprising a reference voltage generator circuit, wherein an output terminal of the reference voltage generator circuit is coupled to the first node.

Example 10. The circuit of Example 7, further comprising: a current source; and a third transistor in diode connected configuration, wherein a drain terminal of the third transistor is coupled to an output terminal of the current source, a source terminal of the third transistor is coupled to the reference node, and a gate terminal of the third transistor is coupled to the drain terminal of the third transistor, wherein the first node is coupled to the gate terminal of the third transistor.

Example 11. The circuit of Example 10, further comprising a fourth transistor, wherein a gate terminal of the fourth transistor is coupled to the second node, and a source terminal of the fourth transistor is coupled to the reference node.

Example 12. In an embodiment, a circuit includes: a low-pass filter comprising a resistor and a capacitor, wherein the resistor is coupled between a first node and a second node, and the capacitor is coupled between the second node and a reference node; and a power-down circuit comprising a first transistor and a second transistor coupled in series between the second node and the reference node, wherein a drain terminal of the first transistor is coupled to the second node, wherein a source terminal of the first transistor is coupled to the first node and coupled to a drain terminal of the second transistor, wherein a source terminal of the second transistor is coupled to the reference node, wherein a gate terminal of the first transistor and a gate terminal of the second transistor are coupled to an input terminal of the power-down circuit.

Example 13. The circuit of Example 12, wherein during operation of the circuit, the input terminal of the power-down circuit is configured to be coupled to a control signal, wherein the control signal is configured to toggle between a first voltage and a second voltage, wherein the first transistor and the second transistor are configured to be turned on when the control signal has the first voltage, and are configured to be turned off when the control signal has the second voltage.

Example 14. The circuit of Example 13, wherein during operation of the circuit, the first node is configured to be supplied with a third voltage.

Example 15. The circuit of Example 14, wherein the first transistor and the second transistor are N-type transistors, wherein the first voltage is higher than a threshold voltage of the first transistor.

Example 16. The circuit of Example 15, wherein the first voltage has a first positive value, the second voltage is zero, and the threshold voltage of the first transistor has a second positive value.

Example 17. The circuit of Example 15, wherein the reference node is configured to be coupled to electrical ground.

Example 18. The circuit of Example 14, wherein the first transistor and the second transistor are P-type transistors.

Example 19. The circuit of Example 18, wherein the reference node is configured to be coupled to a supply voltage having a positive value.

Example 20. The circuit of Example 19, wherein a threshold voltage of the first transistor has a negative value, wherein a different between the first voltage and the supply voltage is lower than the threshold voltage of the first transistor.

While this invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A circuit comprising:
   a low-pass filter comprising:
      a resistor coupled between a first node and a second node; and
      a capacitor coupled between the second node and a reference node;

a first transistor, wherein a drain terminal of the first transistor is coupled to the second node, and a source terminal of the first transistor is coupled to the first node; and
   a second transistor, wherein a drain terminal of the second transistor is coupled to the first node, and a source terminal of the second transistor is coupled to the reference node, wherein a gate terminal of the first transistor and a gate terminal of the second transistor are coupled to a control node.

2. The circuit of claim 1, wherein during operation of the circuit, the control node is configured to provide a control signal, wherein the control signal is configured to toggle between a first voltage and a second voltage, wherein the first transistor and the second transistor are configured to be turned on when the control signal has the first voltage, and are configured to be turned off when the control signal has the second voltage.

3. The circuit of claim 2, wherein when the first transistor and the second transistor are turned off, a first leakage current flowing through the first transistor is equal to or less than one-thousandth of a second leakage current flowing from the first node via the second transistor to the reference node.

4. The circuit of claim 3, wherein when the first transistor and the second transistor are turned off, a voltage at a first terminal of the resistor is substantially equal to a voltage at a second terminal of the resistor.

5. The circuit of claim 2, wherein the first node is configured to be supplied with a third voltage during operation of the circuit.

6. The circuit of claim 5, wherein the first transistor and the second transistor are N-type metal-oxide-semiconductor (MOS) transistors.

7. The circuit of claim 6, wherein the reference node is an electrical ground node, wherein the first voltage has a positive value, and the second voltage is zero.

8. The circuit of claim 7, wherein the first voltage is higher than a first threshold voltage of the first transistor and a second threshold voltage of the second transistor.

9. The circuit of claim 7, further comprising a reference voltage generator circuit, wherein an output terminal of the reference voltage generator circuit is coupled to the first node.

10. The circuit of claim 7, further comprising:
   a current source; and
   a third transistor in diode connected configuration, wherein a drain terminal of the third transistor is coupled to an output terminal of the current source, a source terminal of the third transistor is coupled to the reference node, and a gate terminal of the third transistor is coupled to the drain terminal of the third transistor, wherein the first node is coupled to the gate terminal of the third transistor.

11. The circuit of claim 10, further comprising a fourth transistor, wherein a gate terminal of the fourth transistor is coupled to the second node, and a source terminal of the fourth transistor is coupled to the reference node.

12. A circuit comprising:
   a low-pass filter comprising a resistor and a capacitor, wherein the resistor is coupled between a first node and a second node, and the capacitor is coupled between the second node and a reference node; and
   a power-down circuit comprising a first transistor and a second transistor coupled in series between the second node and the reference node, wherein a drain terminal of the first transistor is coupled to the second node, wherein a source terminal of the first transistor is coupled to the first node and coupled to a drain terminal of the second transistor, wherein a source terminal of the second transistor is coupled to the reference node, wherein a gate terminal of the first transistor and a gate terminal of the second transistor are coupled to an input terminal of the power-down circuit.

13. The circuit of claim 12, wherein during operation of the circuit, the input terminal of the power-down circuit is configured to be coupled to a control signal, wherein the control signal is configured to toggle between a first voltage and a second voltage, wherein the first transistor and the second transistor are configured to be turned on when the control signal has the first voltage, and are configured to be turned off when the control signal has the second voltage.

14. The circuit of claim 13, wherein during operation of the circuit, the first node is configured to be supplied with a third voltage.

15. The circuit of claim 14, wherein the first transistor and the second transistor are N-type transistors, wherein the first voltage is higher than a threshold voltage of the first transistor.

16. The circuit of claim 15, wherein the first voltage has a first positive value, the second voltage is zero, and the threshold voltage of the first transistor has a second positive value.

17. The circuit of claim 15, wherein the reference node is configured to be coupled to electrical ground.

18. The circuit of claim 14, wherein the first transistor and the second transistor are P-type transistors, wherein the reference node is configured to be coupled to a supply voltage having a positive value.

19. The circuit of claim 18, wherein a threshold voltage of the first transistor has a negative value, wherein a difference between the first voltage and the supply voltage is lower than the threshold voltage of the first transistor.

20. The circuit of claim 12, further comprising:

a current source; and a third transistor in diode connected configuration, wherein a drain terminal of the third transistor is coupled to an output terminal of the current source, a source terminal of the third transistor is coupled to the reference node, and a gate terminal of the third transistor is coupled to the drain terminal of the third transistor, wherein the first node is coupled to the gate terminal of the third transistor.

\* \* \* \* \*